(12) United States Patent
Ferreiro et al.

(10) Patent No.: US 7,196,405 B1
(45) Date of Patent: *Mar. 27, 2007

(54) SILICON PACKAGE WITH INTEGRAL HEATER

(75) Inventors: Pablo Ferreiro, Erie, PA (US); Kenneth Martin, Erie, PA (US); John Cline, Shippensburg, PA (US)

(73) Assignee: Bliey Technologies Inc., Erie, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/156,353

(22) Filed: Jun. 17, 2005

Related U.S. Application Data

(63) Continuation-in-part of application No. 10/931,663, filed on Sep. 1, 2004, now Pat. No. 7,061,086.

(51) Int. Cl.
*H01L 23/02* (2006.01)
(52) U.S. Cl. .................... 257/678; 257/659; 310/346; 310/349
(58) Field of Classification Search ............... 257/678, 257/659; 310/346, 349
See application file for complete search history.

(56) References Cited

U.S. PATENT DOCUMENTS

| | | | | |
|---|---|---|---|---|
| 5,198,716 A | * | 3/1993 | Godshall et al. ............ 310/349 |
| 5,339,051 A | * | 8/1994 | Koehler et al. ................ 331/65 |
| 5,919,383 A | * | 7/1999 | Beguin et al. .............. 219/209 |
| 6,049,256 A | * | 4/2000 | Fry .............................. 331/69 |
| 6,060,692 A | * | 5/2000 | Bartley et al. .............. 219/210 |
| 6,127,661 A | * | 10/2000 | Fry ............................. 219/497 |
| 6,133,674 A | * | 10/2000 | Fry .............................. 310/343 |
| 6,559,728 B1 | * | 5/2003 | Fry .............................. 331/69 |
| 6,590,280 B2 | * | 7/2003 | Satou et al. ................. 257/682 |
| 6,621,361 B1 | * | 9/2003 | Fry .............................. 331/69 |
| 6,806,557 B2 | * | 10/2004 | Ding .......................... 257/659 |
| 6,833,654 B2 | * | 12/2004 | Rubach ...................... 310/344 |
| 2004/0266048 A1 | * | 12/2004 | Platt et al. ..................... 438/50 |

* cited by examiner

*Primary Examiner*—Minhloan Tran
*Assistant Examiner*—Eduardo A. Rodela
(74) *Attorney, Agent, or Firm*—Richard K. Thomson

(57) ABSTRACT

A hermetic package for electronic components which is made of metallic silicon is disclosed. The package includes a plurality of silicon elements which are bonded together. A metallic layer of platinum or gold is bonded to an internal surface of the hermetically sealed enclosure. While either metallic layer may serve as a heating element by subjecting the electronic circuit connected thereto with a large current, the platinum layer can also be used as a thermal sensor by passing a lower current there through. An internal heater is included to stabilize the performance of the electronic components.

18 Claims, 5 Drawing Sheets

SILICON PACKAGE WITH INTEGRAL HEATER

The present invention is a continuation-in-part of U.S. patent application Ser. No. 10/931,663 filed Sep. 1, 2004 now U.S. Pat. No. 7,061,086.

BACKGROUND AND SUMMARY OF THE INVENTION

The present invention is directed to the field of electronic devices, such as piezoelectric devices. The term "piezoelectric device" includes resonators, filters and surface acoustic wave devices. More particularly, the present invention is directed to a hermetic silicon package for such devices and a method of making a surface mountable electronic component utilizing such a package.

For over 50 years, the assignee of this patent application has provided piezoelectric devices such as quartz resonators, packaged in a glass housing, for use in aerospace applications. For this particular application, it is important that the piezoelectric device be housed in a vacuum chamber to prevent contamination of the quartz crystal since contaminants can cause deterioration of the accuracy of the resonator. While this deterioration is slow and typically involves changes in accuracy in the parts per billion per day range, for aerospace applications where precision accuracy is essential and the resonator needs to operate for 10–50 years on some exploratory missions, any deterioration is detrimental to the function of the resonator and, hence, to the space craft.

With the advent of solid state electronic circuitry, the number of companies manufacturing glass tubes or "bubbles" (of the type previously used for electronic vacuum tubes) has continued to dwindle, commensurate with the demand for their products. For some applications, the glass bubble can be replaced by a copper housing. However, for aerospace environment where the piezoelectric device may be exposed to temperatures exceeding 300° C., copper packages are subject to collapse as the metal reaches a softening point and the internal vacuum may draw contaminants into the cavity. This permits the piezoelectric device housed therein to be subject to whatever contaminants may be contained in the ambient environment, leading to degradation of its properties.

Within the past fifteen years, Sandia National Laboratory has performed some work on a silicon package which may be useful in housing piezoelectric elements for certain applications. This silicon package is taught in U.S. Pat. Nos. 5,198,716 and 5,339,051. Although these patents produce some of the benefits associated with silicon for housing an electronic component, the package taught therein is wholly inadequate for use in aerospace and related applications. A low temperature bonding technique is employed. When subjected to the rigorous environment of outer space, the bond will melt (fail) leading to unacceptable degradation of the performance of the electronic package. Further, the proposed device involves silicon-quartz-silicon bonding, a difficult proposition at best, given the dissimilarity of the materials, made all the more risky by doubling the extent of circumferential area subject to failure by doubling the number of bonds needed. For many applications, this bond failure may not significantly impact the performance of the housed components but, as has been noted, in the demanding environment of aerospace, even the slightest degradation must be resisted as intolerable.

It is, therefore, the intent of this invention to provide a silicon package which can replace the glass bubble and provide the electronic components housed therein a hermetic environment which will perpetuate initial performance, or as close to initial performance as possible, for the duration of the life of the component. Another aspect of the invention is a method of manufacturing a surface mountable electronic component which is capable of such enduring peak performance.

The present invention comprises a hermetic package for enclosing a piezoelectric device comprising a base member made of a single crystal of metallic silicon; a cover made of a single crystal of metallic silicon; a cavity formed between the base member and the cover for receiving the piezoelectric device, the cavity providing a vacuum environment for the piezoelectric device; high temperature bonding means for securing the cover means directly to the base member. The vacuum preferably falls in the range between $1 \times 10^{-5}$ and $1 \times 10^{-11}$ torr, while the high temperature bonding means is preferably is performed in a temperature range of 300° C. and 800° C. While the piezoelectric device may be selected from the group of resonators, filters and surface acoustic wave devices, for aerospace and similar applications, it is preferably an ultra-stable oscillator and, most preferably, a quartz crystal. In the ultra-stable oscillator, the quartz crystal will be provided with first and second gold plated electrodes spaced from opposing surfaces thereof.

The cavity in the package is preferably formed as a recess in at least one of the base member and the cover to provide a place to house the electronic element. Most preferably, the cavity comprises a recess formed in each of the base member and the cover and may be augmented by the addition of a spacer ring. The preferred high temperature bonding means comprises brazing of the cover to the base member using gold indium eutectic alloy at 495° C. This same bonding means is preferably used to secure the piezoelectric device to at least a portion of said cavity. It is a feature of the present invention that the base member and the cover provide means of electrical contact to the piezoelectric device obviating need for lead wires within the package. This is particularly important in the aerospace applications where sealing is crucial and the absence of lead wires eliminates the possibility that the wires can adversely affect the hermetic characteristics of the device.

Another aspect of the present invention involves a hermetic package for an electronic component comprising a base member made of a material selected from the group consisting of metallic silicon, titanium, zirconia, silicon carbide, sapphire, and tantalum; a cover made of the same material as the base member; a cavity formed between the base member and the cover for receiving the electronic component, the cavity providing a vacuum environment for the electronic component; high temperature bonding means for securing the cover means directly to the base member. The vacuum has the same preferred characteristics as the first embodiment, namely, the vacuum falls in the range between $1 \times 10^{-5}$ and $1 \times 10^{-11}$ torr. Similarly, the high temperature bonding means is performed in a temperature range of 300° C. and 800° C., as with the previous embodiment.

Another aspect of the present invention is a method of making a surface mountable electronic component comprising the steps of providing a base member made of a material selected from a group consisting or metallic silicon, titanium, zirconia, silicon carbide, sapphire, and tantalum; providing a cover member made of the same material as the base member and defining a cavity between the base member and the cover large enough to receive the electronic component; bonding the electronic component in the cavity by a method selected from a group consisting of brazing the component in the cavity using thermo-compression bonding at a temperature approaching 500° C., laser welding, E-beam welding, anodic bonding, induction heating; bonding the cover to the base member by a method selected from a group consisting of brazing the component in the cavity using gold indium eutectic alloy at a temperature approaching 500° C., laser welding, E-beam welding, anodic bonding, induction heating, glass frit, or thermo-compression bonding.

The method also preferably includes the step of evacuating the cavity by pulling a vacuum thereon in a range of between $1 \times 10^{-5}$ and $1 \times 10^{-11}$ torr. For some applications, the evacuation step is performed after bonding through a small hole in one of the base member and the cover. For other applications, the evacuation step is performed before the bonding step.

Another detrimental effect for these precision electronic components is variations in temperature. It is a further aspect of the present invention to provide metallic layer bonded to an interior surface of the enclosure. The metallic layer will be selected from a group consisting of platinum and gold. Electric circuitry connects the metallic layer to control means positioned outside the enclosure so as not to interfere with the hermetic nature thereof. Either of these metals can function as a heating element within the package to maintain a more uniform ambient temperature. Platinum can function as both a heating element and a thermal sensor to determine the temperature within the enclosure.

Various other features, advantages and characteristics of the present invention will become apparent to one of ordinary skill in the art after a reading of the following specification.

BRIEF DESCRIPTION OF THE DRAWINGS

The preferred embodiment(s) of the present invention is/are described in conjunction with the associated drawings in which like features are indicated with like reference numerals and in which.

DETAILED DESCRIPTION OF PREFERRED EMBODIMENT(S)

Figure 1:
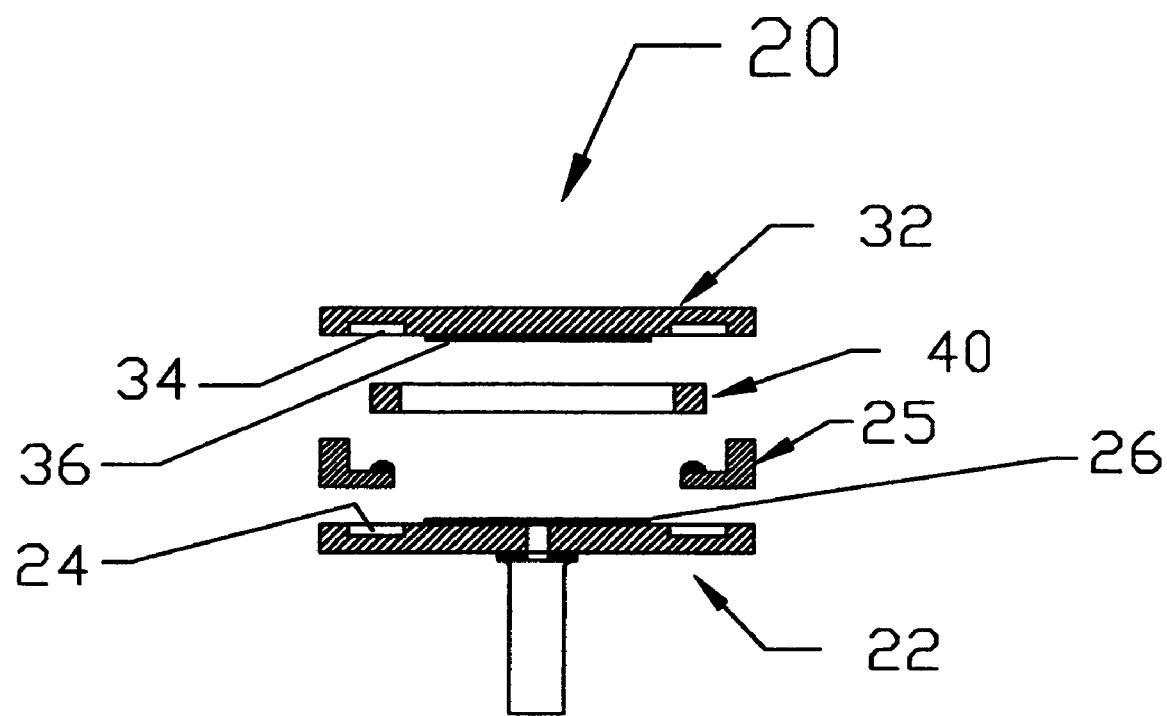
FIG. 1 is an exploded side view in partial cross section of a first embodiment of a surface mountable electronic component employing the silicon package of the present invention.
Figure 2A:
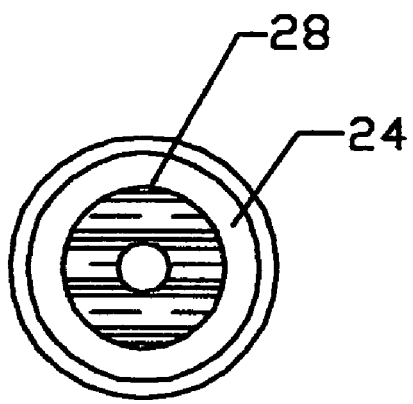
FIG. 2A is a top view of the base member of the first embodiment of the silicon package.
Figure 2B:
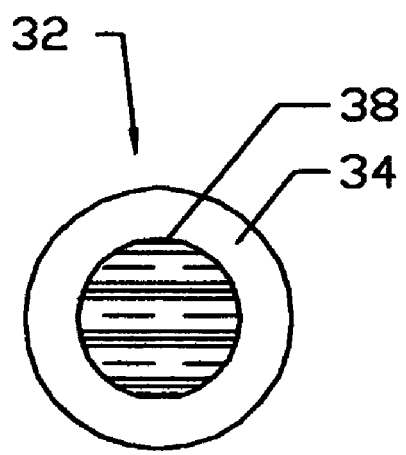
FIG. 2B is a bottom view of the cover of the first embodiment of the silicon package.
Figure 2C:
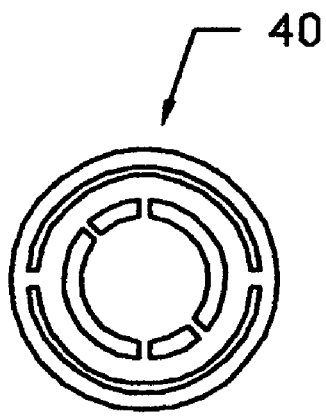
FIG. 2C is a top view of the an exemplary piezoelectric device enclosed in the silicon package in the first embodiment.

A first embodiment of a surface mountable electronic component employing the silicon package of the present invention is depicted in FIG. 1 generally at 20. Surface mountable electronic component 20 includes a base member 22 manufactured from a single crystal of metallic silicon. Similarly, the cover 32 is manufactured from a single crystal of metallic silicon. Both base member 22 and cover 32 have a hollowed out region 24, 34, respectively, to receive the piezoelectric device, in this case a quartz crystal resonator 40. As seen in FIGS. 2A and 2B, the central portions 26 and 36 of base member 22 and cover 32 have a gold electrode 28, 38, respectively, affixed thereto.

In this high performance, low-production-volume application, the base member 22 is mounted atop a glass pedestal 11 with lower end 13 fastened to a source of vacuum (not shown). Quartz crystal resonator 40 is attached to base member 22 by any of a variety of known high temperature methods performed in a temperature range from 300° C. and 800° C., a brazing technique using a gold indium eutectic alloy performed at a temperature of 495° C. being preferred. The same technique is then employed to attach silicon to silicon as cover 32 is attached to upper surface of silicon spacer ring 25 whose lower surface is attached to base member 22. Once assembly of the surface mountable electronic component 20 is completed, the source of vacuum is activated and typically maintained for periods exceeding one week to pull a vacuum in the range of between $1 \times 10^{-6}$ and $1 \times 10^{-10}$ torr to remove all potential pollutants from the cavity created by the hollowed out portions 24 and 34. It will be understood that although the cavity has been shown as being created by a combination of hollowed out portions 24 and 34 and spacer ring 25, it would be possible to form base member 22 and cover member 32 as planar elements and assemble them with a thicker silicon spacer ring, or, alternatively, to create sufficient space in hollowed out portions 24, 34 depending on the specifics of the application, without departing from the scope of this invention. It will further be understood that should a technological advance be made in the area of vacuum equipment where a vacuum of $1 \times 10^{-1}$ torr or less would be possible, such a vacuum would also not depart from the scope of this invention.

Once the package 20 is hermetic to the degree desired, glass pedestal 11 will be melted at a point just below base member 22. The softened glass will be pulled into the opening by the vacuum in the internal cavity. It will be appreciated that if any minute amount of oxygen enter the housing as the sealing takes place, it will react with the silicon forming the internal surface of hollowed out regions 24, 34 forming a glassy, less reactive surface. This further enhances the purity of the hermetic environment ensuring enhance performance of quartz crystal resonator 40.

In this embodiment, the metallic silicon of base member 22 and cover 32 has been treated with a p-doping process during formation of the single crystals to make them conductive, whereas, spacer ring 25 is non-conductive. Accordingly, either the base member 22 or the cover 32, or both, can be utilized to provide electrical connection to the piezoelectric device and/or other electrical components housed within the hermetic package.

Figure 3B:
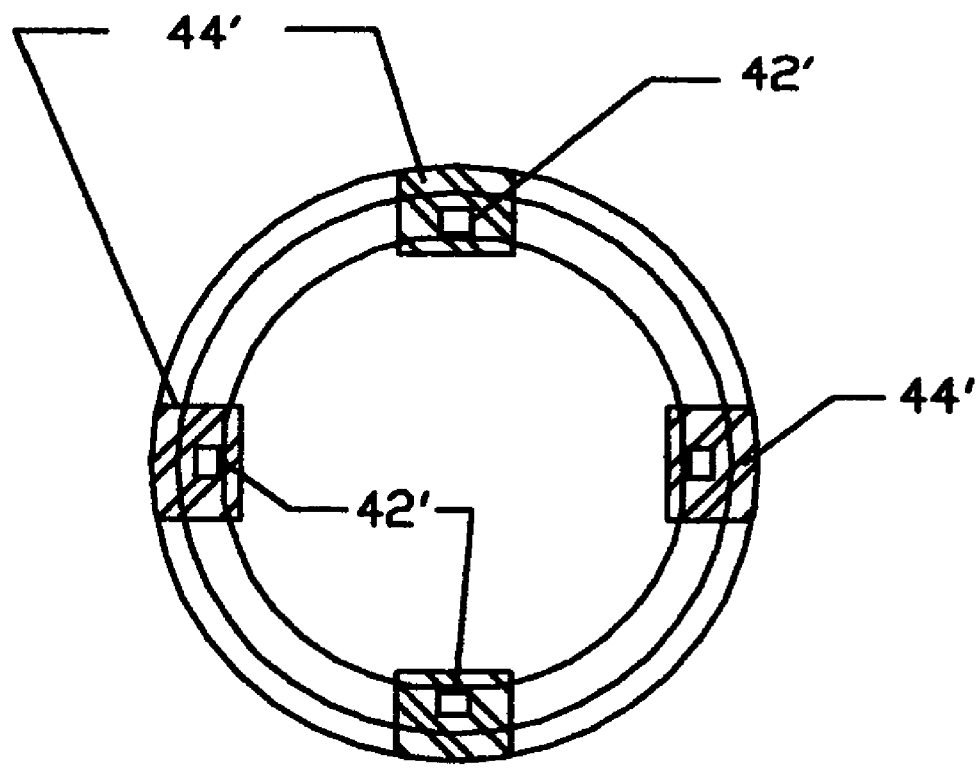
FIG. 3B is a top view of the base member of the second embodiment.
Figure 3A:
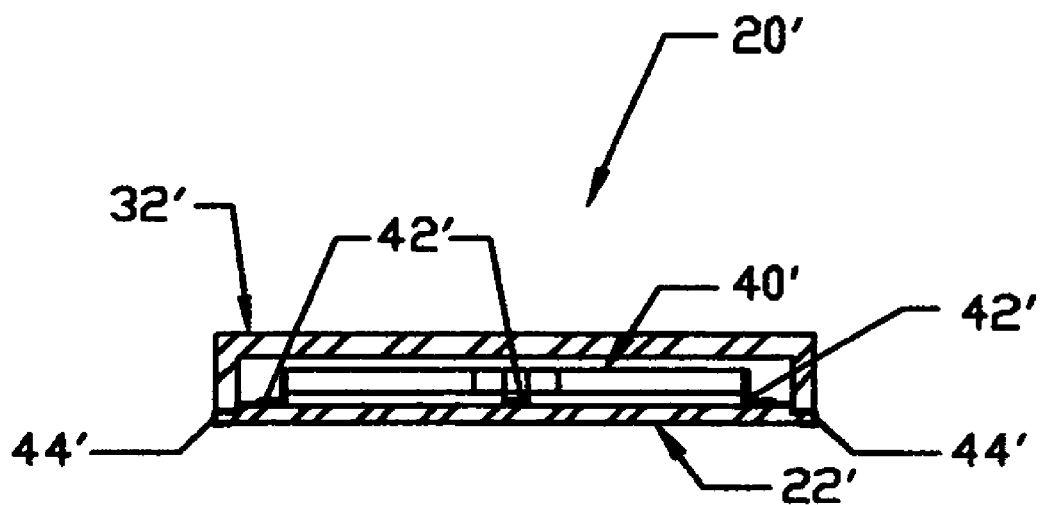
FIG. 3A is a cross-sectional side view of a second embodiment of a surface mountable electronic component employing the silicon package of the present invention.

A second embodiment of the surface mountable electronic component including a hermetic package is shown in FIG. 3A generally at 20'. In this embodiment, the base member 22' and cover 32' are assembled in a vacuum chamber and, therefore, the assembly is performed after the cavity is evacuated. The electronic component 40' is mounted using nickel ribbons 42' which have been gold plated, the nickel ribbons 42' being attached to the electronic component 40' and the base member 22' using the brazing technique described in conjunction with the first embodiment.

In the formation of the single crystal of metallic silicon forming base member 22' and cover 32', the p-doping process renders the silicon non-conductive. Accordingly, silver contact leads 44' are positioned between the base member 22' and the cover 32' in contact with each of the nickel ribbons 42' to permit electrical current to be fed to the electronic component 40'.

While both the first and second embodiments have been described as having base members and covers made of single crystal silicon brazed using gold indium eutectic alloy, it is contemplated that other materials could be used. For example, while silicon is the preferred material, other materials including titanium, zirconia, silicon carbide, sapphire, and tantalum could be used. Similarly, while the brazing technique set forth herein is preferred method of affixing the two halves of the package together as well as fixing the electronic component in place, it is contemplated other bonding techniques including laser welding, E-beam welding, anodic bonding, and induction heating could be used. Finally, although the preferred electronic component is an ultra-stable oscillator in the form of a quartz crystal, it is envisioned that other electronic components including a gallium orthophosphate crystal and a lithium niobate crystal, could be utilized in this hermetic package.

Figure 4A:
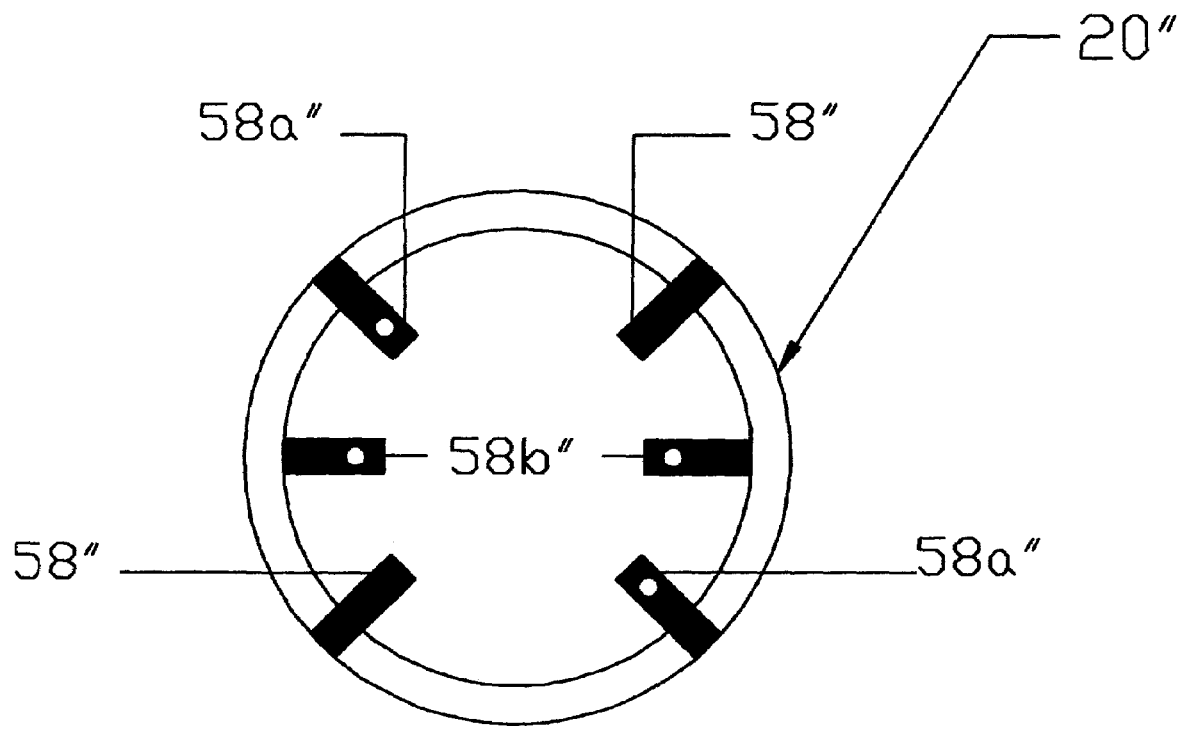
FIG. 4A is a top view of a third embodiment of the present invention with cradle 52" removed.
Figure 4B:
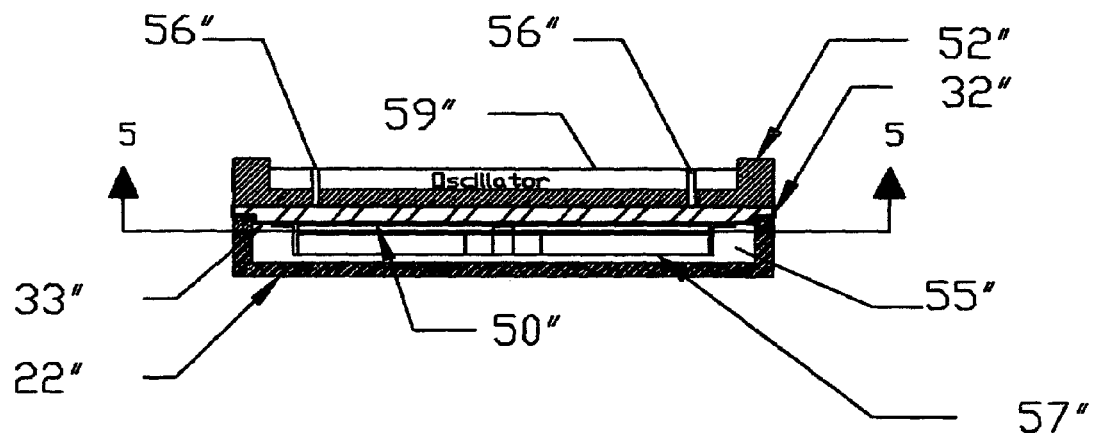
FIG. 4B is a cross-sectional side view of the third embodiment.
Figure 5A:
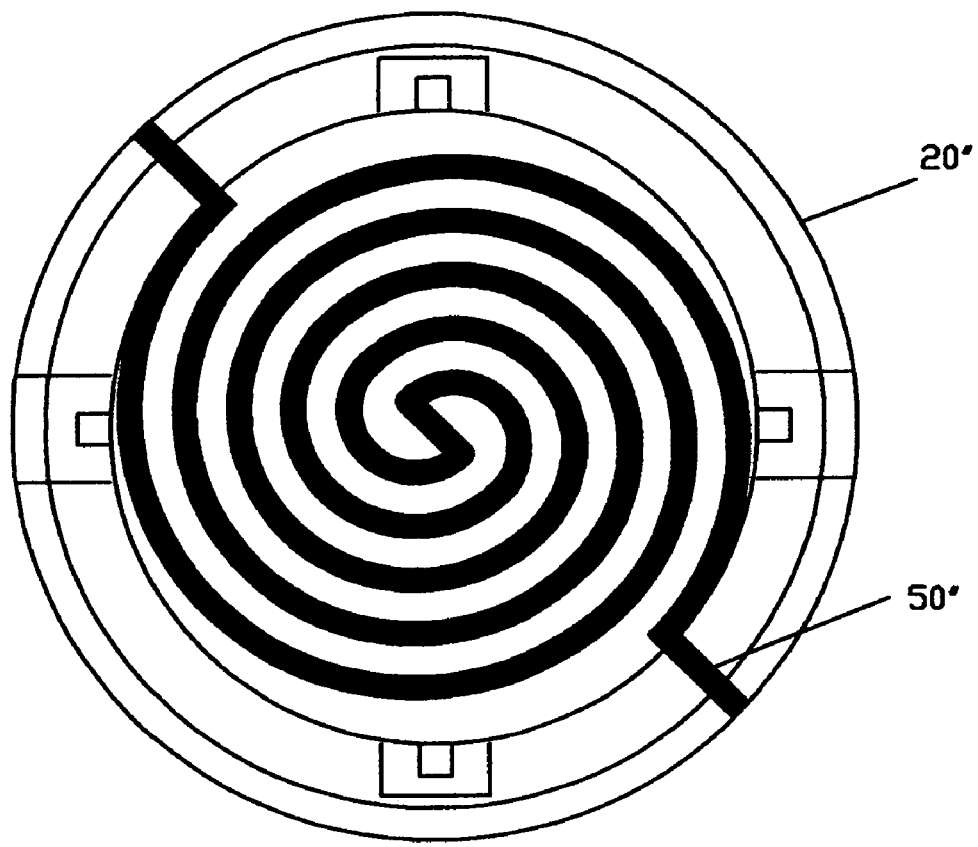
FIG. 5A is a cross-sectional bottom view taken along line 5—5 in FIG. 4B.
Figure 5B:
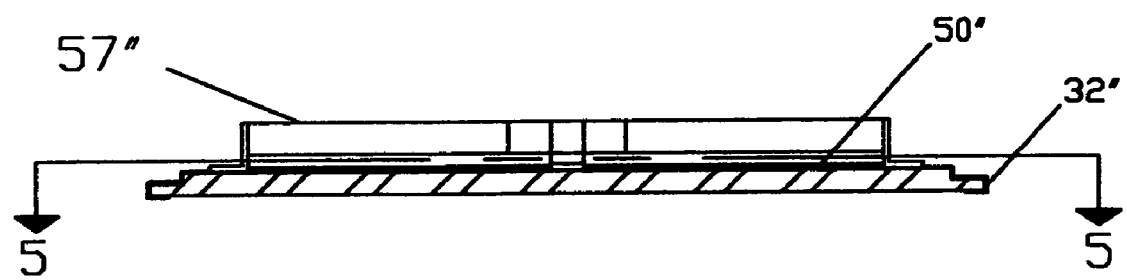
FIG. 5B is an inverted cross-sectional side view of the cover depicted in FIG. 4B.

A third embodiment is shown in FIGS. 4A and 4B generally at 20". In this embodiment, three single crystal metallic silicon elements 22", 32" and 52" are bonded together using the techniques described with respect to the first and second embodiments. A metallic layer 50" is bonded to the lower surface 33" of cover 32" within the hermetically sealed chamber 55". Material for metallic layer 50" will be selected from a group consisting of gold and platinum. Both of these metals are suitable for use as heaters for chamber 55" by running a large current there through. An added benefit of a platinum metallic layer 50" is that platinum can double as a thermal sensor within chamber 55" by subjecting it to a lower amperage current. The serpentine path shown in FIG. 5A for heating element 50" is merely exemplary; heating element 50" may take any shape which a particular application requires. Cradle 52" provides space for mounting oscillator 59" and electrical controls external to the hermetic chamber 55".

The electronic component or device 57" may be a piezoelectric component such as a quartz crystal or may take another form. As shown in FIG. 4B, oscillator 59" and associated electrical control elements are mounted external to the hermetically sealed chamber 55" and electrical contacts 56" extend through element 52" to make connection with silicon element 32". Ribbons 58" are wrapped around to the upper surface of cover 32" (FIG. 4a) with ribbons 58a" providing electrical connection for heating/sensing element 50", ribbons 58b" providing electrical connection for electrical device 57" and the remaining ribbons 58" provided for another component which may be mounted within chamber 55".

It will be understood that once a vacuum has been applied to chamber 55", for some applications, it may be beneficial to fill chamber 55" with helium, hydrogen, nitrogen or an inert gas. The presence of the gas can facilitate the heating of the elements within the chamber to a uniform temperature.

Various other changes, alternatives and modifications will become apparent to one of ordinary skill in the art following a reading of the foregoing specification. It is intended that any such changes, alternatives and modifications as fall within the scope of the appended claims be considered part of the present invention.

We claim:

1. A hermetically packaged electronic device comprising
    a) an enclosure of metallic silicon made of a plurality of elements including an upper element and a lower element, said enclosure maintaining a vacuum in a range between $1\times10^{-6}$ and $1\times10^{-11}$ torr;
    b) means bonding said plurality of elements together, said bonding means securing a first silicon element directly to a second silicon element;
    c) a piezoelectric device contained within said enclosure;
    d) a metallic layer bonded to a lower surface of said upper element, said metallic layer functioning as a heating element;
    e) control means positioned outside of said enclosure;
    f) electrical circuitry interconnected between said metallic layer and said control means.

2. The device of claim 1 wherein said bonding means comprises thermo-compression bonding means performed at high temperature for securing said plurality of elements of said enclosure directly to each other.

3. The device of claim 2 wherein said plurality of elements include a base member and a cover configured to fit thereon.

4. The package of claim 3 wherein said base member and said cover directly provide means of electrical contact to said piezoelectric device obviating need for leads and wires within and protruding from said package.

5. The device of claim 3 wherein said base member and said cover are each comprised of single metallic silicon crystals.

6. The device of claim 3 wherein said heating element comprises a non-venting, electrically conductive element bonded to a nether surface of said cover.

7. The device of claim 6 further comprising thermo-compression bonding means between said heating element and said cover, the same bonding means used to secure said plurality of enclosure elements together.

8. The device of claim 6 wherein said heating element is made from the group consisting of platinum and gold.

9. The device of claim 8 wherein said heating element is made from platinum and also serves as said temperature sensing means.

10. The package of claim 2 wherein said thermo-compression bonding means is performed in a temperature range of between 300° C. and 800° C.

11. The device of claim 10 wherein said thermo-compression bonding means comprises brazing of said cover to said base member using gold indium eutectic alloy at 495° C.

12. The device of claim 1 wherein said piezoelectric device is an ultra-stable oscillator.

13. The device of claim 12 wherein said ultra-stable oscillator comprises a quartz crystal.

14. The device of claim 13 wherein said ultra-stable oscillator further comprises first and second gold plated electrodes spaced from opposing surfaces of said quartz crystal.

15. The device of claim 1 wherein said metallic layer is selected from the group consisting of platinum and gold.

16. The device of claim 15 wherein said metallic layer is platinum.

17. The device of claim 16 wherein said metallic layer serves as both a heating element and a thermal sensor.

18. The device of claim 15 wherein said metallic layer serves as a heating element to control the temperature within said enclosure.

* * * * *